United States Patent [19]

Crawford

[11] Patent Number: 4,914,589

[45] Date of Patent: Apr. 3, 1990

[54] THREE-DIMENSIONAL IMAGES OBTAINED FROM TOMOGRAPHIC DATA USING A VARIABLE THRESHOLD

[75] Inventor: Carl R. Crawford, Milwaukee, Wis.

[73] Assignee: General Electric Company, Milwaukee, Wis.

[21] Appl. No.: 261,533

[22] Filed: Oct. 24, 1988

[51] Int. Cl.$^4$ .............................................. G06F 15/72
[52] U.S. Cl. ................................ 364/43.17; 364/518; 364/522; 364/413.22
[58] Field of Search ...................... 364/413.14–413.19, 364/413.22, 518, 521, 522

Primary Examiner—Clark A. Jablon
Attorney, Agent, or Firm—James O. Skarsten; Douglas E. Stoner

[57] ABSTRACT

Three-dimensional images are formed from tomographic data collected in a medical diagnostic imaging system. The images include structures of specific interest having voxel densities not confined to a single, exclusive area of the image histogram. A variable threshold dependent on the particular voxel locations is used in extracting the 3-D surface definition in order to eliminate partial volume artifacts in the 3-D image.

8 Claims, 5 Drawing Sheets

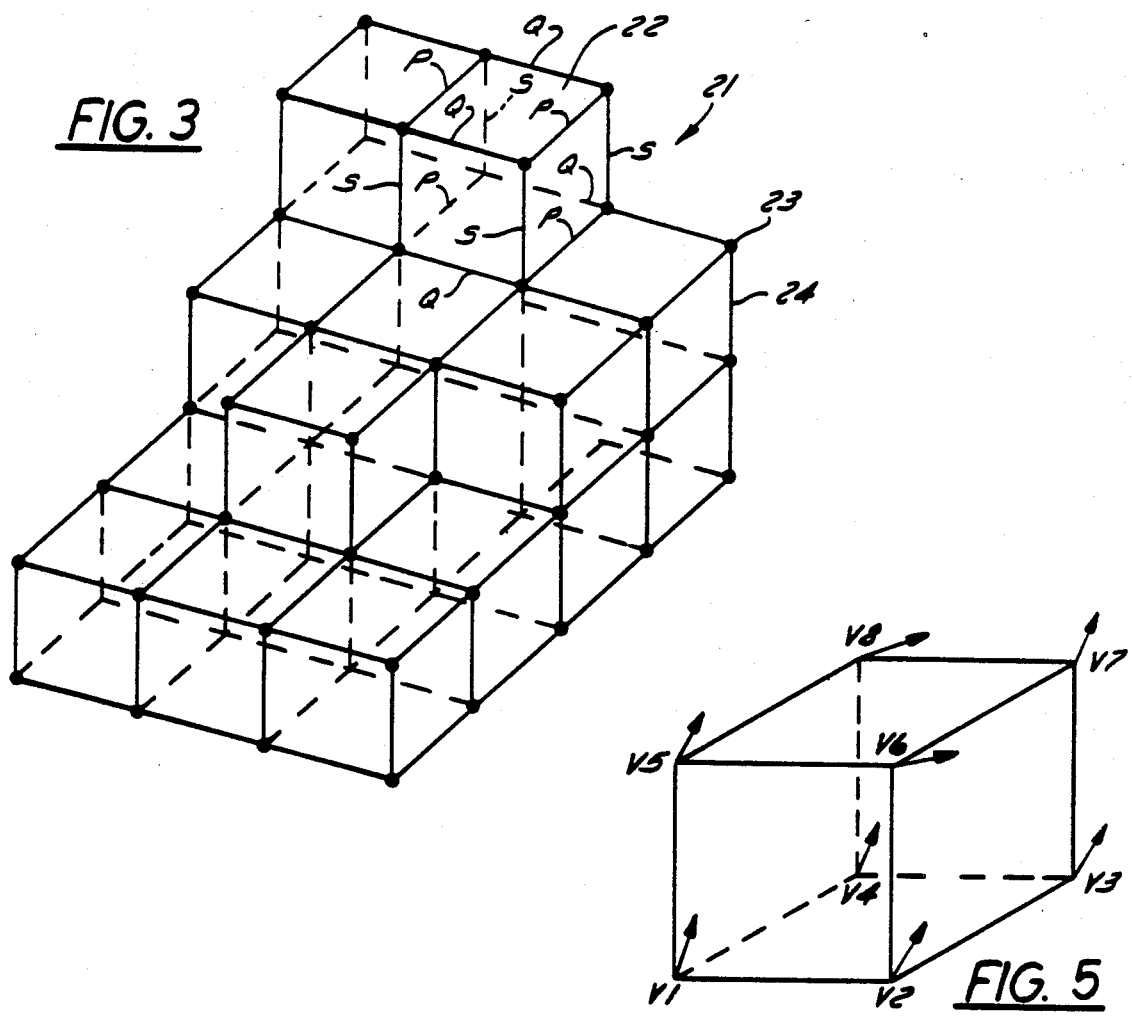
FIG. 3
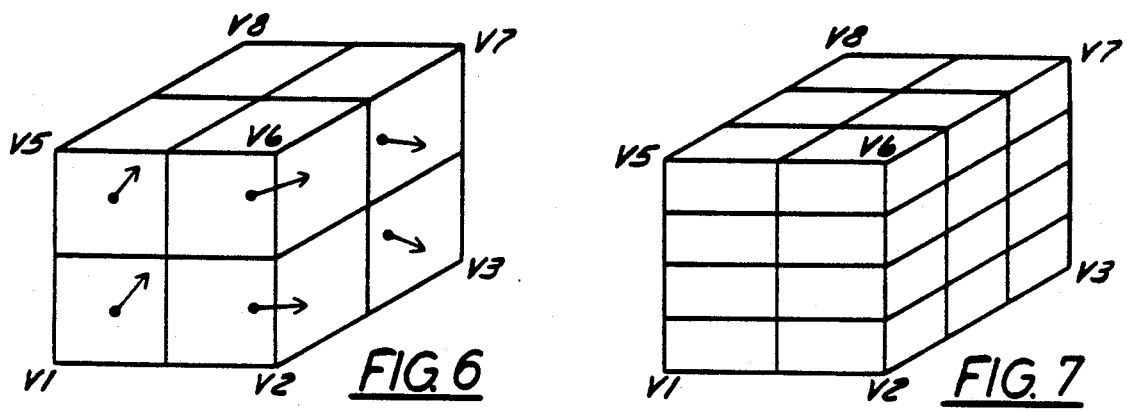
FIG. 5
FIG. 6
FIG. 7

THREE-DIMENSIONAL IMAGES OBTAINED FROM TOMOGRAPHIC DATA USING A VARIABLE THRESHOLD

The present application is related to U.S. Ser. No. 261,532 and to U.S. Ser. No. 261,534, filed of even date herewith; and to U.S. Ser. No 125,662, U.S. Ser. No. 125,510, and U.S. Ser. No. 125,426, now U.S. Pat. No. 4,868,748, all three of which were filed on Nov. 25, 1987.

BACKGROUND OF THE INVENTION

The present invention relates in general to three-dimensional (3-D) display of tomographic data, and more specifically to forming 3-D images from a tomographic data set in which a surface is defined by a variable threshold.

Tomographic medical imaging employs the collection of data representing cross sections of a body. A plurality of object interrogations can be processed mathematically to produce representations of contiguous cross-sectional images. Such cross-sectional images are of great value to the medical diagnostician in a non-invasive investigation of internal body structure. The technique employed to collect the data can be x-ray computed tomography, nuclear magnetic resonance tomography, single-photon emission tomography, positron emission tomography, or ultrasound tomography, for example.

A body to be imaged exists in three dimensions. Tomographic devices process data for presentation as a series of contiguous cross-sectional slices along selectable axes through the body. Each cross-sectional slice is made up of a number of rows and columns of voxels (parallelopiped volumes with certain faces corresponding to pixel spacing within each slice and others corresponding to slice spacing), each represented by a digitally stored number related to a computed signal intensity in the voxel. In practice, an array of, for example, 64 slices may each contain 512 by 512 voxels. In normal use, a diagnostician reviews images of a number of individual slices to derive the desired information. In cases where information about a surface within the body is desired, the diagnostician relies on inferences of the 3-D nature of the object derived from interrogating the cross-sectional slices. At times, it is difficult or impossible to attain the required inference from reviewing contiguous slices. In such cases, a synthesized 3-D image would be valuable.

Synthesizing a 3-D image from tomographic data is a two-step process. In the first step, a mathematical description of the desired object is extracted from the tomographic data. In the second step, the image is synthesized from the mathematical description.

Dealing with the second step first, assuming that a surface description can be synthesized from knowledge of the slices, the key is to go from the surface to the 3-D image. The mathematical description of the object is made up of the union of a large number of surface elements (SURFELS). The SURFELS are operated on by conventional computer graphics software, having its genesis in computer-aided design and computer-aided manufacturing, to apply surface shading to objects to aid in image interpretation through a synthesized two-dimensional image. The computer graphics software projects the SURFELS onto a rasterized image and determines which pixels of the rasterized image are turned on, and with what intensity or color. Generally, the shading is lightest (i.e., most intense) for image elements having surface normals along an operator-selected line of sight and successively darker for those elements inclined to the line of sight. Image elements having surface normals inclined more than 90 degrees from the selected line of sight are hidden in a 3-D object and are suppressed from the display. Foreground objects on the line of sight hide background objects. The shading gives a realistic illusion of three dimensions.

Returning now to the problem of extracting a mathematic description of the desired surface from the tomographic slice data, this step is broken down into two subtasks, namely the extraction of the object from the tomographic data, and the fitting of a surface to the extracted object. A number of ways are available to do the first subtask. For example, it is possible to search through the signal intensities in the voxels of a slice to discern regions where the material forming the object has sufficient signal contrast with surrounding regions. For example, signal intensities characteristic of bone in x-ray computed tomography have high contrast with surrounding tissue. A threshold may then be applied to the voxels to identify each one in the complete array lying in the desired object from all voxels not in the object.

Referring now to the second subtask, one technique for fitting a 3-D surface to the extracted object is known as the dividing cubes method which is disclosed in commonly assigned U.S. Pat. No. 4,719,585, issued Jan. 12, 1988, which is hereby incorporated by reference. By the dividing cubes method, the surface of interest is represented by the union of a large number of directed points. The directed points are obtained by considering in turn each set of eight cubically adjacent voxels in the data base of contiguous slices. Gradient values are calculated for these large cube vertices using difference equations. The vertices are tested against a threshold to determine if the surface passes through the large cube. If it does, then the large cube is subdivided to form a number of smaller cubes, referred to as subcubes or subvoxels. By interpolation of the adjacent point densities and gradient values, densities are calculated for the subcube vertices and a gradient is calculated for the center of the subcube. The densities are tested (e.g., compared to the threshold). If some are greater and some less than the threshold, then the surface passes through the subcube. In that case, the location of the subcube is output with its normalized gradient, as a directed point. It is also possible to define a surface using a range of densities (e.g., an upper and a lower threshold). Thus, where thresholds are mentioned herein, a range is also intended to be included. The union of all directed points generated by testing all subcubes within large cubes through which the surface passes, provides the surface representation. The directed points are then rendered (i.e., rasterized) for display on a CRT, for example.

In displaying a 3-D image of particular objects, it has been found that an image artifact can arise such that part of a structure is missing. For example, in generating a 3-D image of a skull using the dividing cubes method as described above, the top areas of the skull may drop out of the image. This dropping out has been found to be caused by a partial volume effect. Thus, where the object surface of interest tends toward being much less than the thickness of the acquired slices, each voxel can contain both bone (high CT density) and air or soft tissue (low CT density). The resulting CT number for the voxel is then of an intermediate CT density. Such voxels with a reduced density number are not extracted by the surface generator since their density is below the threshold used to extract the bone. If the threshold is lowered to account for the lower density voxels, increased noise will degrade the final image.

Accordingly, it is a principal object of the present invention to provide a method and apparatus for generating 3-D images of tomographic data without partial volume artifacts.

It is another object to extract 3-D surface definitions with reduced noise using a dividing cubes method.

SUMMARY OF THE INVENTION

These and other objects are achieved in a method and apparatus for extracting a surface within a plurality of 2-D tomograhic slices, each slice including a plurality of voxels. Voxel densities are provided in a tomographic data set such that all slices are substantially parallel and are spaced along a z-axis. Voxels or portions of voxels are identified which contain the surface according to an identification criterion. The criterion applied to each respective voxel is dependent on the location along the z-axis of the respective slice containing the voxel. Such criterion can include comparison of voxels with a variable threshold or can include selective weighting of voxels followed by comparison to a predetermined constant threshold.

BRIEF DESCRIPTION OF DRAWINGS

The novel features of the invention are set forth with particularity in the appended claims. The invention itself, however, both as to its organization and method of operation, together with further objects and advantages thereof, may best be understood by reference to the following description taken in conjunction with the accompanying drawings in which:

FIG. 3 represents a portion of an array of tomographic data from which a surface is to be extracted.

FIG. 5 shows the gradient normals associated with each cube vertex. FIG. 6 shows subcubes and their gradient normals.

FIG. 7 shows subdivision using a different amount of interpolation than FIG. 6.

DETAILED DESCRIPTION OF PREFERRED EMBODIMENTS

Figure 1:
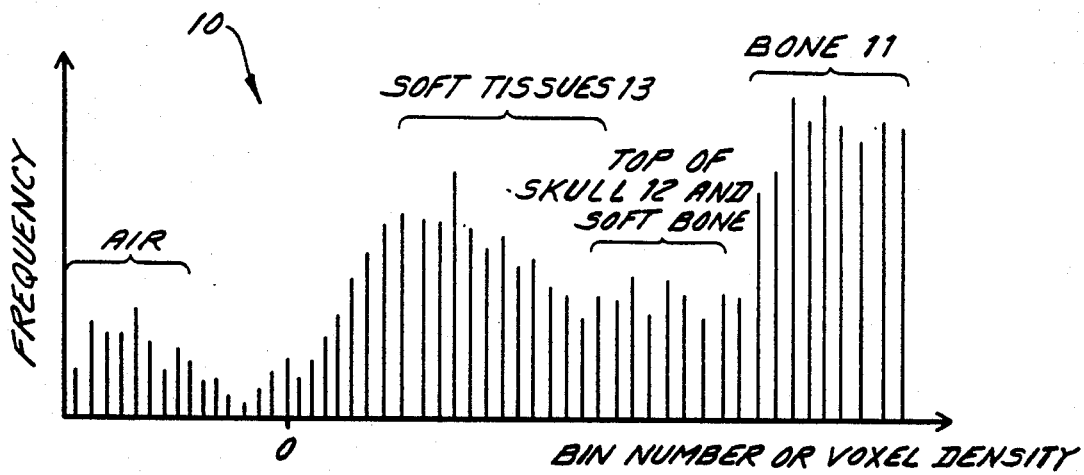
FIG. 1 is a histogram showing statistics of a CT tomographic data set.
Figure 2:
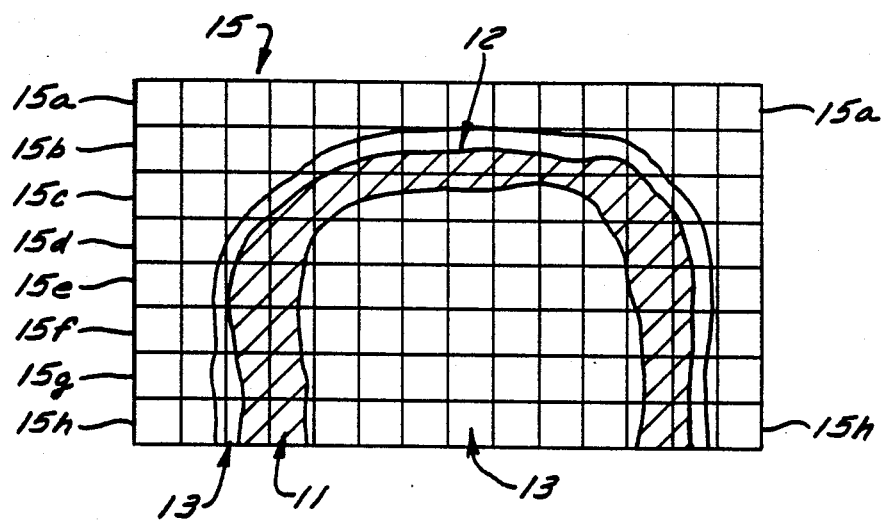
FIG. 2 is a coronal cross section of a human head intersecting a plurality of slices showing the problem of partial volume effects.

The source of partial volume artifacts will be described with reference to FIGS. 1 and 2. A histogram 10 in FIG. 1 plots the frequency (i.e., number of occurrences) of each respective voxel density of a slice into a plurality of bins. FIG. 2 shows a voxel grid 15 superimposed over a coronal cross section of a portion of a head including bone 11 and soft tissues 13 (e.g., skin and brain matter). Tomographic data resulting from a diagnostic imaging scan according to FIG. 2 will comprise a 3-D matrix of density values each corresponding to a respective voxel in grid 15. Axial slices 15a–15h are shown in cross section and have a slice thickness such that a single voxel is large enough to contain structures of different types. Each voxel density will reflect the average tissue density within the entire voxel. Thus, in the area 12 at the top of the skull bones, voxel densities are low even with bone present due to the partial filling of voxels by bone.

Returning to histogram 10 in FIG. 1, bone 11 occupies the upper end of the histogram due to its high CT density, while soft tissue with low CT densities are below bone in the histogram. Voxels in area 12 at the top of the skull have intermediate density values because they are partially filled with bone and partially filled with soft tissue or air.

In finding a 3-D object within a plurality of slices, a threshold (e.g., a particular bin number) can be chosen whereby all voxels greater than the threshold are included in the object and all voxels less than the threshold are excluded from the object. Such a scheme works well when an object is the only occupant of a certain area in the histogram. In CT data, bone is substantially the only body structure appearing at the high end of the histogram. The threshold selected to identify bone is made as high as possible to segregate bone from all other objects.

In addition to voxels of corresponding CT density values, each area of the histogram also contains noise (i.e., extraneous information). The noise is slice dependent such that slices containing more dense structure have more noise voxels. If partial volume artifacts were avoided by merely lowering the threshold, then noise would be greatly increased in the final image.

According to this invention, the above problems are solved by use of a threshold value which varies from slice to slice or even voxel to voxel. In the example of FIG. 2, the threshold value is lower for the slices including the top of the skull than for the remaining slices. In particular, it is desirable in that example to provide a threshold value which is linearly ramped from its lowest value at the very top of the skull to its highest value in the area of the orbits (i.e., eye sockets). Alternatively, the same result can be obtained with a single constant threshold by selectively weighting the voxel densities within the slices. For example, voxel densities in the slices including the top of the skull can be multiplied by a weighting coefficient which increases the density values.

The invention will now be specifically described in connection with an implementation of the dividing cubes method. Referring to FIG. 3, a part of a 3-D tomographic array 21 is shown including a plurality of cubes 22 defined by nodes 23 connected by edges 24. Each node 23 represents a signal amplitude of a voxel (i.e., data point) of tomographic data and each edge 24 represents the distance from one voxel to its neighbor. Although the volumes described are referred to as cubes, edges 24 are typically not all of equal length since slice spacing usually does not equal pixel spacing. Pixel spacings P and Q and slice spacing S are shown for cube 12.

Figure 4:
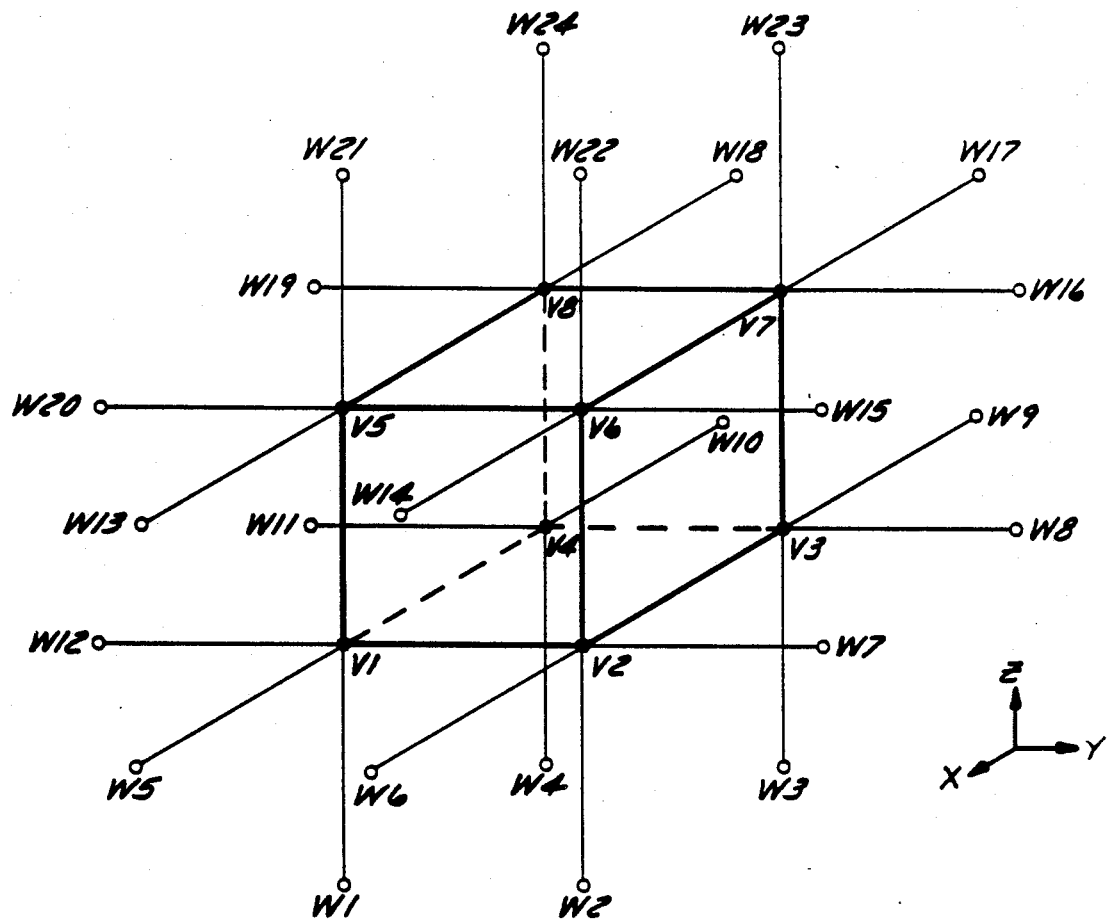
FIG. 4 is a perspective view showing a large cube and its adjacent data points.

In the practice of dividing cubes, each large cube containing the surface to be displayed (as determined by comparisons with a threshold) is subdivided by integer factors (greater than or equal to zero) into a number of subcubes. The vertices of the subcubes are compared to the threshold (or thresholds) corresponding to the slice under consideration in order to identify subcubes through which the surface passes. For such identified subcubes, the subcube location and normalized gradient for the subcube center are concatenated resulting in a directed point. The process of subdivision uses a large cube and adjacent points as shown in FIG. 4. Cubically adjacent voxels from the tomographic data are selected to represent the vertices V1-V8 of the large cube. Points W1-W24 are adjacent to V1-V8 and are used in conjunction with V1-V8 to calculate the gradients at the vertices of the large cube. Interpolation can then be performed on the cube and the gradients.

FIG. 5 shows examples of gradients associated with the vertices of a cube. FIG. 6 represents interpolated subcubes and gradient normals which define the subcubes within the large cube.

FIG. 7 shows subcubes having different interpolation factors along different axes.

Figure 8:
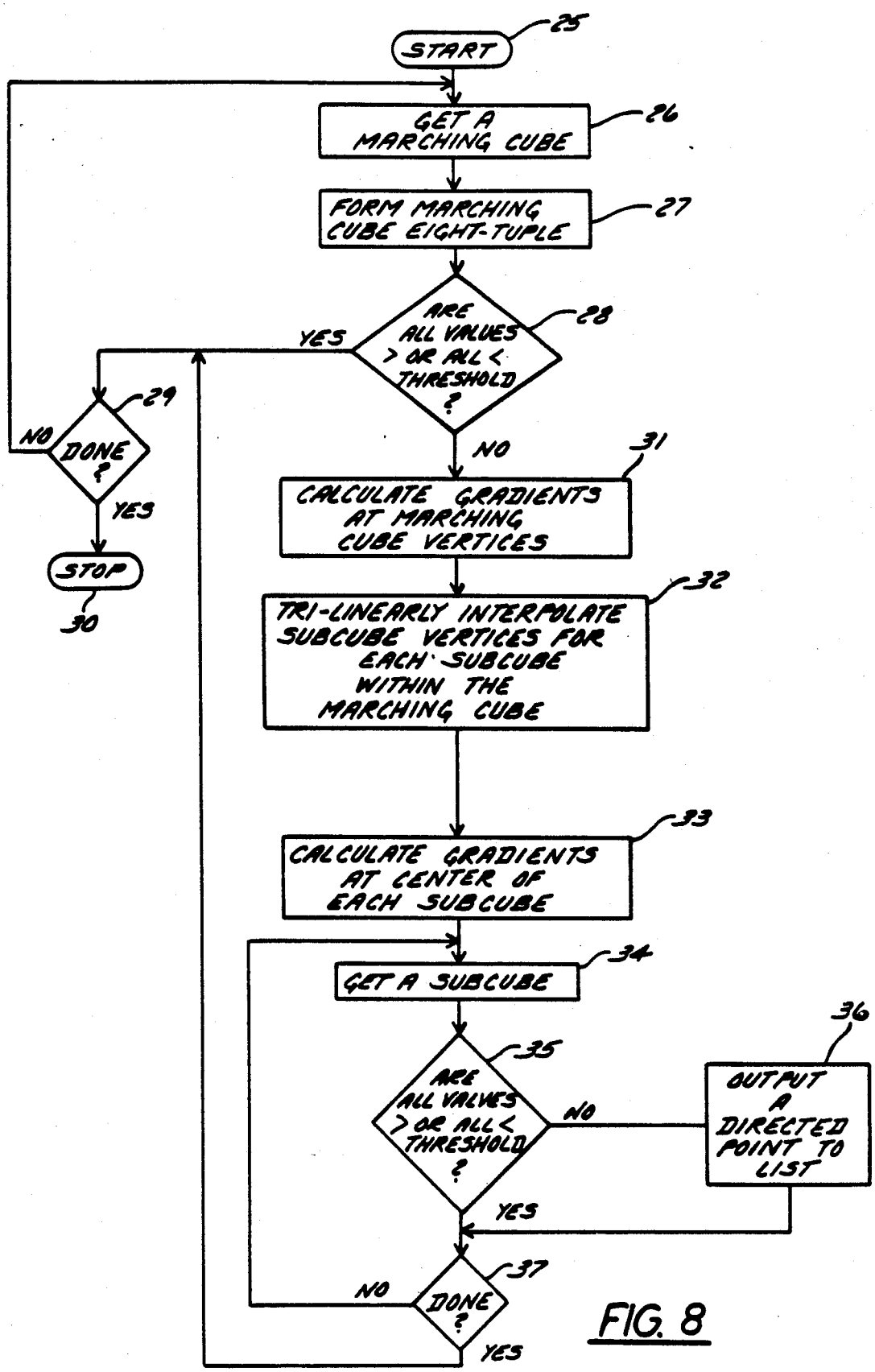
FIG. 8 is a flow chart according to the dividing cubes method.

The dividing cubes method itself will be described in more detail with reference to the flow chart in FIG. 8, which begins at start block 25. In steps 26 and 27, a large cube (i.e., marching cube) is obtained consisting of an eight-tuple of density functions f(x,y,z), namely [f(i,j,k), f(i+1,j,k), f(i,j+1,k), f(i+1,j+1,k), f(i,j,k+1), f(i+1,,j,k+1), f(i,j+1,k+1), f(i+1,j+1,k+1)], where i is the row, j is the column, and k is the slice in the tomographic data. In a data base having N rows, N columns, and M slices (i.e., M is the number of N×N two-dimensional images), the marching cubes are obtained by looping through all combinations of i=2, ... ,N−1; j=2, ... ,N−1; and k=2, ... ,M−1.

For each large cube, the eight vertices are compared to a threshold T in step 28. For each cube, the threshold T is a function of slice k, or T(k). The threshold can further be a two-or three-dimensional function if desired, or T(i,j,k). As a further alternative, threshold T can be held constant while the vertices compared to the constant threshold are first multiplied by a weighting coefficient which has a value dependent on the location (e.g., slice number) of each respective vertex. If all of the values for the vertices are greater than the threshold or if all are less than the threshold, then the surface does not pass through the large cube, and so the method checks to see if all large cubes have been processed in step 29. If finished, then the method halts at stop block 30 and other functions may then be performed (such as rendering and display of the defined surface). Otherwise, a return is made to step 26 to begin processing another large cube.

If step 28 determines that there are vertices both above and below the threshold (or, alternatively, both inside and outside a slice-dependent threshold range), then gradient values are calculated at each of the large cube vertices in step 31. Central differences can be used to calculate gradient estimates ·g(i,j,k)=[$g_x$(i,j,k), $g_y$(i,j,k), $g_z$(i,j,k)] for each vertex (i,j,k) in a large cube as follows:

$$g_x(i,j,k) = [f(i+1,j,k) - f(i-1,j,k)]c_1$$

$$g_y(i,j,k) = [f(i,j+1,k) - f(i,j-1,k)]c_2$$

$$g_z(i,j,k) = [f(i,j,k+1) - f(i,j,k-1)]c_3$$

where $c_1$, $c_2$ and $c_3$ are constants depending on the pixel spacing and the slice spacing in the tomographic data. Thus, eight values each of $g_x$, $g_y$ and $g_z$ are found.

Specifically, the values of $c_1$, $c_2$ and $c_3$ for each calculation are found according to:

$$c_1 = 1/(2*PIXEL_x)$$

$$c_2 = 1/(2*PIXEL_y)$$

$$c_3 = 1/(z_{k+1} - z_{k-1})$$

where $PIXEL_x$ and $PIXEL_y$ are the pixel spacings within the slice along the x- and y-axes, respectively, and $(z_{k+1} - z_{k-1})$ is the distance between the two slices on either side of slice k.

In step 32, density values are found for the subcube vertices by tri-linear interpolation. With positive integer interpolation factors A, B and C corresponding to i, j and k, subcube increments within a large cube are defined as $\Delta_i = 1/A$, $\Delta_j = 1/B$, and $\Delta_k = 1/C$, respectively. The vertices of each large cube v(i,j,k) are denoted as v(0,0,0), V(1,0,0), v(0,1,0), v(1,1,0), v(0,0,1), v(1,0,1), v(0,1,1), and v(1,1,1). Linear interpolation gives each subcube vertex density f'(I,J,K) defined as f(i+I$\Delta_i$, j+J$\Delta_j$,k+K$\Delta_k$), where I=0,1, ... ,A, J=0,1, ... ,B, and K=0,1, ... ,C.

In step 33, gradient values are calculated for the center of each subcube using tri-linear interpolation of the gradients at the large cube vertices $g_x$, $g_y$ and $g_z$. The subcube gradients (each a vector G(I,J,K) with components $g_x$, $g_y$ and $g_z$) for each of the x, y and z components are $G_{x,y,z}(I,J,K) = g_{x,y,z}(i+[I+0.5]\Delta_i, j+[J+.5]\Delta_j, k+[J+.5]\Delta_k)$, where I=0,1, ... ,A−1, J=0,1, ... ,B−1, and K=0,1, ... ,C−1.

Following the calculations of the subcubes and their gradients, the subcubes are fetched one at a time in step 34 by looping through all combinations of I=0, ... ,A−1, J=0, ... ,B−1, and K=0, ... ,C−1. For each combination of I, J, and K, a subcube is defined by the eight-tuple [f'(I,J,K), f'(I+1,J,K), f'(I,J+1,K), f'(I+1,J+1,K), f'(I,J,K+1), f'(I+1,J,K+1), f'(I,J+1,K+1), f'(I+1,J+1,K+1)]. In step 35, the current subcube is tested against its appropriate threshold. If all subcube vertices are not either above or all below the threshold, then the location of the subcube and its normalized gradient are output to a list as a directed point in step 36, otherwise a check for completion is done in step 37. The gradient output to the list during step 36 is a normalized gradient defined as G(I,J,K)/|G(I,J,K)|.

When all subcubes have been processed, step 37 branches back to step 29 to process the next large cube.

Figure 9:
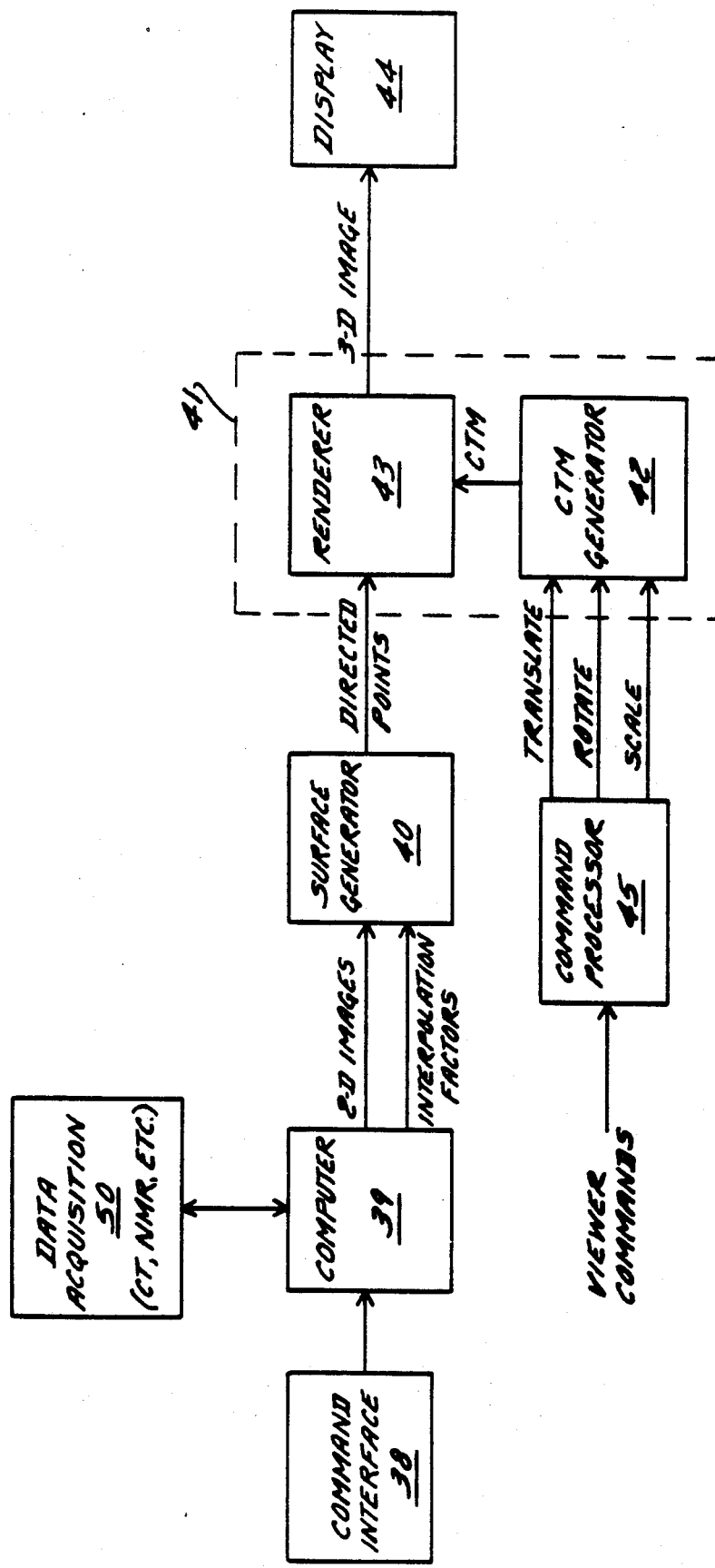
FIG. 9 is a block diagram of processing hardware in one embodiment of the invention.

A preferred apparatus for practicing the invention is shown in FIG. 9. A data acquisition system 50 collects tomographic data slices of a subject under control of a computer 39. An operator provides commands via a command interface 38 to computer 39 in order to control slice-dependent threshold values or slice dependent weighting coefficients, for example. Computer 39 reconstructs two-dimensinal tomographic images from the data collected by data acquisition system 50. The tomographic images are provided to a surface generator 40. Computer 39 also provides values for the interpolation factors for forming subcubes to surface generator 40. Surface generator 40 implements the dividing cubes method to generate a number of directed points defining the surface that are fed to a display processor 41 which includes a Current-Transformation-Matrix (CTM) generator 42 and a renderer 43.

CTM generator 42 receives a viewer's commands via a command processor 45 for scaling, moving and rotating the object and forms the CTM which is provided to renderer 43 to operate on the directed points. Renderer 43 synthesizes the 3-D image (including projecting directed points onto 3-D pixels and determining shading of illuminated pixels) which is rasterized and sent to display 44 which could be a cathode-ray tube (CRT), for example.

While preferred embodiments of the invention have been shown and described herein, it will be understood that such embodiments are provided by way of example only. Numerous variations, changes and substitutions will occur to those skilled in the art without departing from the spirit of the invention. Accordingly, it is intended that the appended claims cover all such variations as fall within the spirit and scope of the invention.

What is claimed is:

1. A method for extracting a surface within a plurality of two-dimensional tomographic slices, each slice including a plurality of voxels, said method comprising the steps of:
    acquiring voxel densities within said slices such that all slices are substantially parallel and spaced along a z-axis; and
    identifying at least portions of each voxel containing said surface according to an identification criterion, the criterion applied to each respective voxel being dependent on the location along said z-axis of the respective slice containing said voxel.

2. The method of claim 1 wherein said identifying step comprises the steps of:
    selectively weighting said voxel densities by a weighting coefficient, said weighting coefficient having a value for applying to each respective slice which is dependent on the location of said respective slice; and
    comparing said voxels to a predetermined threshold.

3. The method of claim 2 wherein said value of said coefficient is further dependent on the location of a respective voxel within each respective slice.

4. The method of claim 1 wherein said identifying step comprises comparing said voxels to a variable threshold, said threshold having a value for comparing to voxels within each respective slice which is dependent on the location of said respective slice.

5. The method of claim 4 wherein said value of said threshold is further dependent on the location of a respective voxel within each respective slice.

6. Apparatus for extracting a surface within a plurality of two-dimensional tomographic slices, each slice including a plurality of voxels, said apparatus comprising:
    data means for storing voxel densities of said slices arranged according to location within substantially parallel slices which are spaced along a z-axis; and
    identifying means coupled to said data means for identifying at least portions of each voxel containing said surface according to an identification criterion, the criterion applied to each respective voxel being dependent on the location along said z-axis of the respective slice containing said voxel.

7. The apparatus of claim 6 wherein said identifying means comprises:
    selective weighting means coupled to said data means for selectively weighting said voxel densities; and
    comparison means coupled to said selective weighting means for comparing selectively weighted voxel densities to a predetermined threshold.

8. The apparatus of claim 6 wherein said identifying means includes comparison means coupled to said data means for comparing said voxel densities to a variable threshold, said variable threshold having a value dependent on the location of the respective slice containing each voxel.

* * * * *